(12) United States Patent
Przybyla et al.

(10) Patent No.: US 7,056,759 B2
(45) Date of Patent: Jun. 6, 2006

(54) METHOD FOR MAKING A MICROELECTROMECHANICAL SYSTEM USING A FLEXURE PROTECTION LAYER

(75) Inventors: James R. Przybyla, Philomath, OR (US); Arthur R. Piehl, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 168 days.

(21) Appl. No.: 10/833,203

(22) Filed: Apr. 27, 2004

(65) Prior Publication Data

US 2005/0239231 A1    Oct. 27, 2005

(51) Int. Cl.
*H01L 21/02* (2006.01)

(52) U.S. Cl. .............................. 438/53; 438/50; 438/48; 257/417; 257/418; 257/419

(58) Field of Classification Search .................. 438/53, 438/50, 48; 216/2; 257/415, 418, 419, 414, 257/417
See application file for complete search history.

(56) References Cited

U.S. PATENT DOCUMENTS

| | | | | |
|---|---|---|---|---|
| 4,849,050 A | * | 7/1989 | Evans et al. | 438/53 |
| 4,849,071 A | * | 7/1989 | Evans et al. | 438/53 |
| 5,095,401 A | * | 3/1992 | Zavracky et al. | 361/283.4 |
| 5,985,688 A | * | 11/1999 | Bruel | 438/53 |
| 6,020,215 A | * | 2/2000 | Yagi et al. | 438/52 |
| 6,428,713 B1 | | 8/2002 | Christenson et al. | |
| 6,465,355 B1 | | 10/2002 | Horsley | |
| 2002/0182091 A1 | * | 12/2002 | Potter | 417/413.3 |
| 2002/0185699 A1 | * | 12/2002 | Reid | 257/414 |
| 2002/0197761 A1 | | 12/2002 | Patel et al. | |
| 2003/0116528 A1 | * | 6/2003 | Bernstein et al. | 216/2 |
| 2004/0219706 A1 | * | 11/2004 | Wan | 438/53 |

\* cited by examiner

*Primary Examiner*—Bradley K. Smith
*Assistant Examiner*—Steven J. Fulk (57) ABSTRACT

A microelectromechanical system is made by establishing a flexure protection layer over a portion of at least one flexure which is located on a substrate. The flexure protection layer is deposited such that a portion of the flexure is left exposed. Contact is established between a flexure-engaging element and the exposed portion of the flexure. The remaining flexure protection layer is removed after the flexure-engaging element is patterned and etched.

25 Claims, 4 Drawing Sheets

METHOD FOR MAKING A MICROELECTROMECHANICAL SYSTEM USING A FLEXURE PROTECTION LAYER

BACKGROUND

The present invention relates generally to microelectromechanical systems having at least one flexure element and more particularly to a method of making a microelectromechanical system using a flexure protection layer.

During the formation of microelectromechanical system (MEMS) devices, flexure thicknesses should be carefully controlled to maintain a consistent spring constant. Various etching processes may be used in formation of MEMS devices. The various etching processes may decrease the thickness of the flexure. This may cause the spring constant to vary. Even small deviations of the spring constant are crucial because the spring constant has an inverse cubic dependence on the thickness of the flexure. Additional layers on the flexure may be beneficial, however, they may contribute to the flexure thickness and thus deviations in flexure spring constant. Further, subsequent etching processes may attack the additional layers; therefore the problem of spring constant variation may not be adequately solved.

SUMMARY

Disclosed herein is a method of making a microelectromechanical system using a flexure protection layer. The method includes establishing a flexure protection layer over at least a portion of a flexure located on a substrate. The flexure protection layer is established such that a portion of the flexure is left exposed. A flexure-engaging element is established in contact with the exposed portions of the flexure. The remaining flexure protection layer is removed after at least one of a patterning or etching process.

BRIEF DESCRIPTION OF THE DRAWINGS

Objects, features and advantages of the present invention will become apparent by reference to the following detailed description and drawings, in which like reference numerals correspond to similar, though not necessarily identical components. For the sake of brevity, reference numerals having a previously described function may not necessarily be described in connection with subsequent drawings in which they appear.

DETAILED DESCRIPTION

The present disclosure is directed to systems utilizing microelectromechanical system (MEMS) devices. The MEMS may be suitable for use in conjunction with integrated circuits. Functional devices include, but are not limited to, spatial light modulators and various display devices. MEMS devices may be mounted to associated substrate structures by various methods and elements, including, but not limited to variously configured flexures. Additionally, it is contemplated that the various microelectromechanical system devices may have flexure elements integrated therein. For example, digital micromirror devices may include hinges necessary for proper operation. Fabry-Perot filters and various other devices that modulate light may include one or more flexure layers necessary for operation. Various other electronic devices may include assemblies or subassemblies mounted to or suspended by suitably configured flexure elements.

In many situations, it is necessary to control the performance characteristics of the flexure in order to provide proper and/or consistent function of the microelectromechanical system. Performance characteristics include, but are not limited to spring constant of the flexure element.

In order to provide consistency in the flexure spring constant, control of factors, such as flexure thickness, is an important consideration. The spring constant may be expressed in terms of the Beam equation, $$k = EL^3/(WT^3) \tag{1}$$

where L is the length of the flexure, W is the flexure width, T is the flexure thickness, and E is Young's modulus. Thus, the spring constant varies as a $$\frac{1}{T^3}$$

dependence on the thickness of the flexure. Variations in flexure thickness and/or width may adversely impact the spring constant and consequently flexure performance.

The present disclosure is directed to a method for making microelectromechanical devices having at least one flexure characterized by sufficiently consistent performance characteristics including, but not limited to, spring constant. The resulting flexure may also exhibit essentially uniform width and/or thickness and may have at least one surface exhibiting minimal evidence of etch artifacts/effects.

Figure 1:
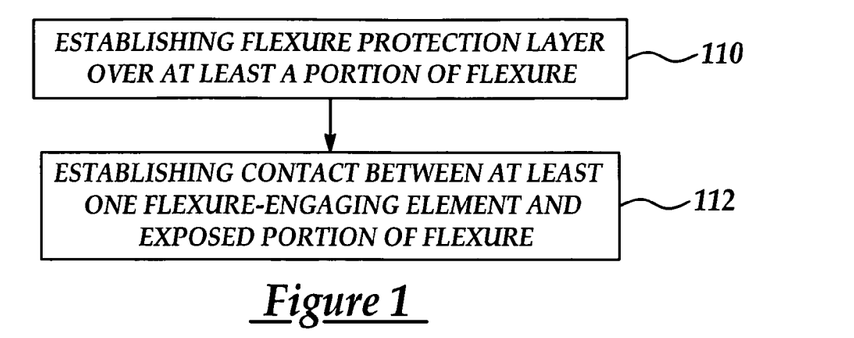
FIG. 1 is a process diagram of an embodiment of the method.

The method of making an embodiment of the microelectromechanical system as disclosed herein is outlined in FIG. 1. In the method, at least one flexure protection layer is established over a portion of at least one flexure located on a substrate such that at least a portion of the flexure is exposed as at reference numeral 110. After the flexure protection layer is established, contact between at least one flexure-engaging element and the exposed portion of the flexure may be established as at reference numeral 112.

Establishment of at least one flexure protection layer may be accomplished by any suitable deposition process including, but not limited to, chemical vapor deposition, plasma enhanced chemical vapor deposition, and/or physical vapor deposition techniques, spin on techniques, sputtering, lamination, oxidation, electrochemical plating, and the like followed by a suitable patterning as desired and/or required. The flexure protection layer may be composed of any material or materials resistant to one or more post-deposition fabrication processes, particularly etch processes.

Suitable flexure protection layer materials are those that provide at least some resistance to etching and/or patterning processes and materials. However, it is also important that the flexure protection layer materials are capable of being selectively removed from at least a portion of the associated flexure as desired or required with minimal adverse effects to the flexure. Nonlimiting examples of such materials include various sacrificial materials such as photoresist compounds, polyimide, polysilicon, silicon dioxide, amorphous silicon, silicon nitride, and the like.

In the embodiment of the method depicted in FIG. 1, it is contemplated that a portion of the flexure is exposed upon establishment of the flexure protection layer as at reference numeral 110. Exposure of the desired portion of the flexure may be accomplished by any suitable method. For example, exposure may be accomplished by suitable masks that prevent deposition of the flexure protection layer on the desired region of the flexure. Alternately, exposure may be accomplished by selective removal of a portion of established flexure protection material by any suitable method or means.

The portion of flexure that is exposed may be any desired region or location. Generally, the exposed region of the flexure will be a location to which at least one flexure-engaging element will be affixed or brought into contact with the flexure.

Contact between the exposed region of the flexure and the at least one flexure-engaging element (as at reference numeral 112) may be accomplished by any suitable technique. In one embodiment, it is contemplated that both the flexure and the flexure-engaging element are composed of metal-based materials. Establishment of the flexure-engaging element may be accomplished by any suitable metal deposition technique that will establish appropriate contact and/or bonding between the flexure-engaging element and the exposed portion of the flexure. Examples of such methods include, but are not limited to, sputtering, chemical vapor deposition and the like.

The term flexure-engaging element, as used herein, may be any suitable structure that can be connected to the desired flexures. It is contemplated that the flexure-engaging element may be an active element such as one actively utilized in the function of the associated device (such as an electronic, a reflective, a diffractive, or a filter element to name a few). The flexure-engaging element may be a nonactive element such as one attached to the flexure for stability or other purposes. It is also contemplated that the flexure-engaging element may include active and inactive components.

Figure 2:
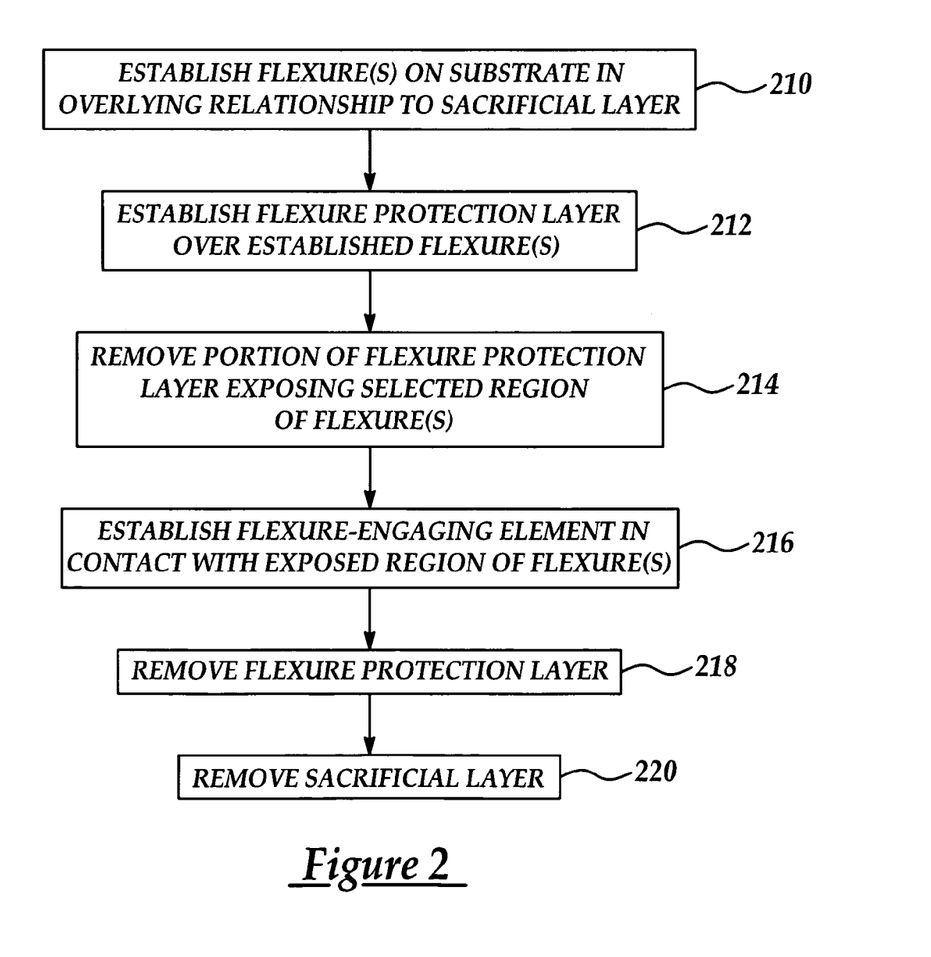
FIG. 2 is a detailed process diagram of an embodiment of the method.

Turning now to FIG. 2, an embodiment of the method is depicted in more detail. At least one flexure is established on a substrate in overlying relationship with a suitable sacrificial layer, as at reference numeral 210. The flexure may be established by any suitable method. Nonlimiting examples of such methods include the various deposition processes previously described. It is contemplated that establishment may broadly include deposition, patterning, etching and/or selective deposition techniques.

The sacrificial layer present on the substrate may be established by any suitable process and may contain any material suitable for supporting the flexure(s) during subsequent fabrication procedures. It is contemplated that the flexure(s) may be directly or indirectly supported on the sacrificial layer. Direct support is construed as direct contact between the flexure and the sacrificial material. It is also contemplated that certain compatible materials may be interposed between the sacrificial layer and the flexure if desired or required. Nonlimiting examples of sacrificial layer establishment processes include various deposition techniques as well as suitable patterning and etching techniques.

The flexure(s) may be established in such a manner that they are in contiguous contact with suitable posts, support beams, or the like. Alternatively, the flexure may be directly connected to the substrate through a hole in the sacrificial layer.

It is to be understood that the flexure(s) may be composed of any suitable material. In an embodiment, the flexure(s) are composed of metals, metal alloys, metal compounds, silicon and/or mixtures thereof. Non-limiting examples of suitable metals or metal compounds include tantalum aluminum, tungsten silicon nitride, titanium nitride and the like. Additionally, various aluminum alloys may be used as a metal material in the flexure(s), either alone or in combination with other metal alloys or metal compounds.

As outlined in FIG. 2, it is contemplated that multiple flexures may be established in an amount and at locations suitable for supporting the active element of the microelectromechanical device or other suitable element. Where multiple flexures are employed, it is contemplated that at least two flexures may be established with a sacrificial layer material interposed between the elements that support the flexures, such as posts or the like. The sacrificial layer material is also interposed between substrate and flexure.

Once the flexure(s) have been established, a suitable flexure protection layer may be established in overlying relationship to the flexure(s), as at reference numeral 212. Establishment may include suitable deposition patterning and etching processes.

The flexure protection layer may be composed of any suitable material (such as those described herein) that will provide appropriate protection to the flexure(s) during subsequent fabrication processes. The flexure protection material may be the same material as that employed in the sacrificial layer or it may be a different material.

Once the flexure protection layer is established, a portion of the flexure protection layer may be removed, as at reference numeral 214, to expose a selected region of the respective flexure(s). Localized or selective flexure protection layer removal may be accomplished by any suitable process. The flexure region from which the flexure protection layer is removed may be any region as desired or required. Generally the localized region will be one configured to receive and support at least one flexure-engaging element thereon.

Once the localized region of the flexure(s) has been exposed, a flexure-engaging element may be established in contact with the exposed region of flexure(s), as at reference numeral 216. Establishment may be accomplished by any suitable process, such as deposition, patterning, and etching.

After the flexure-engaging element has been established, the flexure protection layer may be removed by any suitable process, as at reference numeral 218. This may be followed by removal of sacrificial layer material, as at reference numeral 220. Where appropriate, the removal of the flexure protection layer and sacrificial layer may progress in one clearout step.

Figure 3:
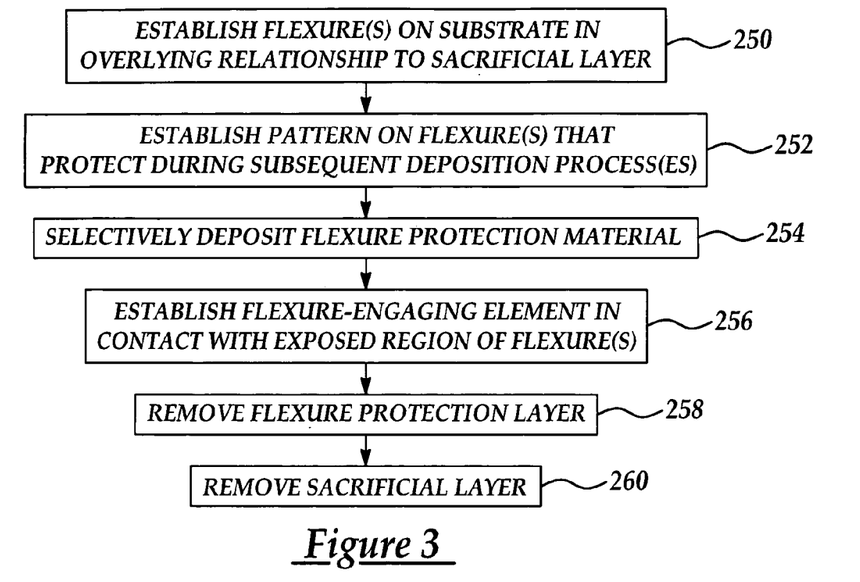
FIG. 3 is a diagram of an alternate process flow of an embodiment of the method.

Referring now to FIG. 3, it is contemplated that the flexure(s) may be established on a substrate in overlying relationship to the sacrificial layer, as at reference numeral 250. Once the flexure(s) are established by any suitable deposition method, a pattern may be established on the flexure(s) so that it protects the flexures during subsequent deposition process(es), as at reference numeral 252. A resist material may be deposited in a patterned configuration as desired and/or required. The resist material may be one that prevents certain materials, such as flexure protection materials, from adhering to the desired flexure regions. Adhesion prevention may be accomplished by preventing deposition and/or by promoting removal of the resist and/or deposited material.

Once the resist pattern has been established, flexure protection material may be deposited in overlying relationship to the flexure(s) as at reference numeral 254 such that a portion of the flexure(s) is exposed. Generally the portion of the flexure(s) exposed is a localized region that is configured to receive and support at least one flexure-engaging element thereon.

A flexure-engaging element may then be established, as at reference numeral 256. Establishing the flexure-engaging element may be accomplished by suitable processes such as deposition, patterning, and/or etching.

After the flexure-engaging element has been established, the flexure protection layer may be removed, as shown at reference numeral 258. This may be followed by removal of the sacrificial layer as at reference numeral 260. Where appropriate, the flexure protection layer and sacrificial layer may be removed simultaneously in a single clearout step.

Figure 4:
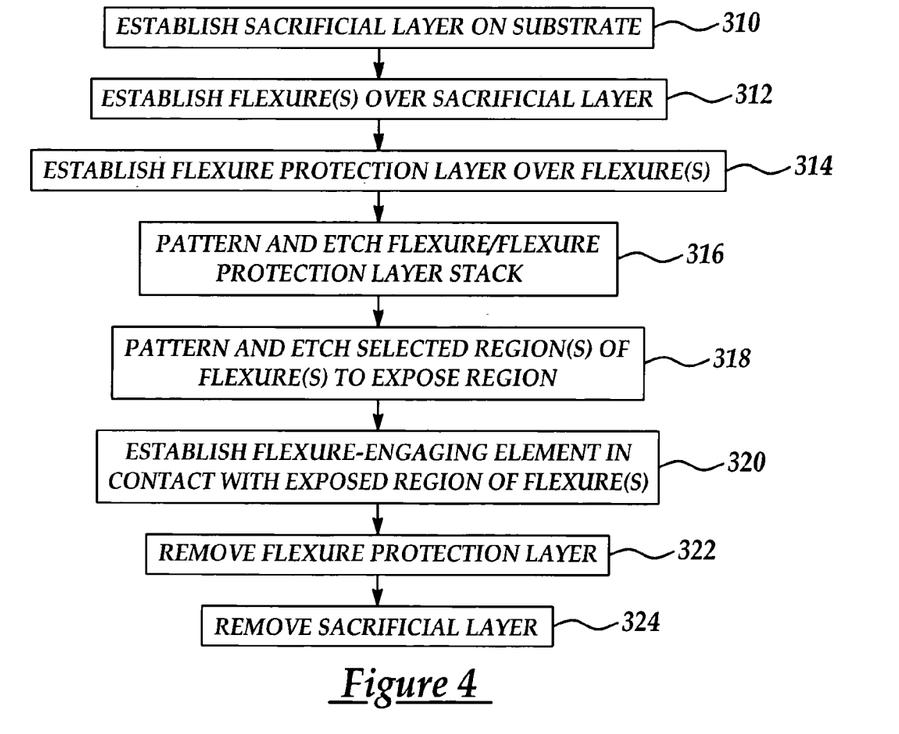
FIG. 4 is a diagram of another alternate process flow of an embodiment of the method.

It is also contemplated that an embodiment of the method may progress with sequential depositions of the flexure material and flexure protection material as outlined in FIG. 4. In the method as outlined in FIG. 4, a sacrificial layer may be established on a substrate, as shown at reference numeral 310.

The flexure material may be established in overlying relationship to the sacrificial layer (reference numeral 312) in any suitable manner. Once the flexure material is established, a suitable flexure protection layer may be established over the flexure material, as at reference numeral 314.

The stack composed of the flexure material and flexure protection material may be patterned and etched in any suitable manner as at reference numeral 316. Once this step has been completed, selected regions of the resulting flexure with overlying layer of flexure protection material may be patterned and etched to remove selected regions of the flexure protection material and expose the underlying flexure as at reference numeral 318.

A flexure-engaging element (e.g. an active element) may then be established in overlying relationship with the sacrificial layer and in contact with the exposed region(s) of the flexure, as shown at reference numeral 320. The flexure-engaging element may be patterned and etched as desired and/or required prior to removal of the flexure protection layer and/or sacrificial layer as at reference numerals 322 and 324.

Figure 5A:
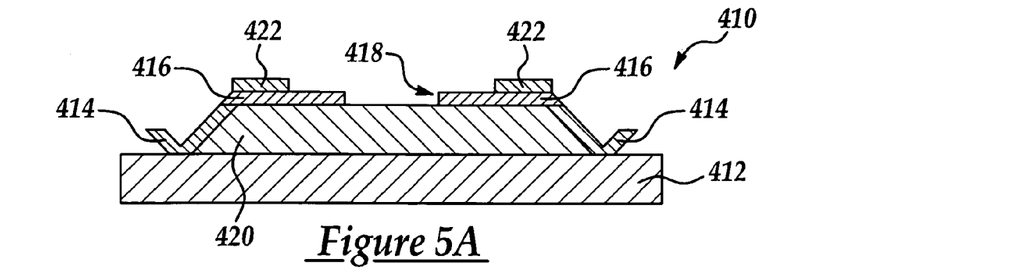
FIGS. 5A, 5B, and 5C are build sequences according to an embodiment of the method.
Figure 5B:
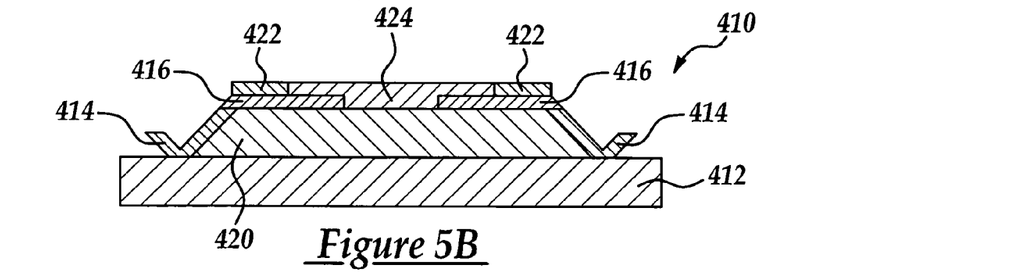
Figure 5C:
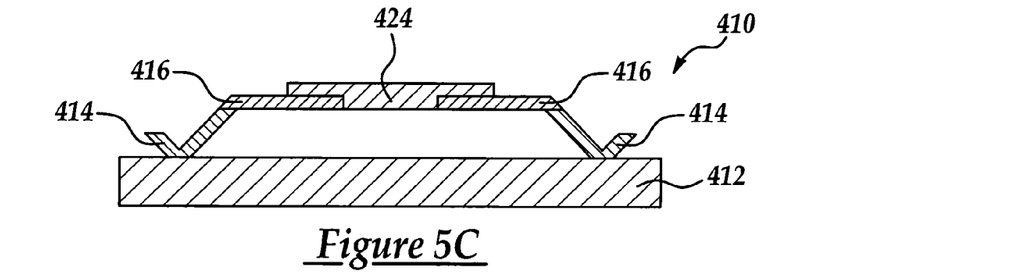

A microelectromechanical system build sequence according to embodiments of the method is generally depicted in FIGS. 5A through 5C and in FIGS. 6A through 6D. Generally the sets of figures illustrate various methods of making embodiments of the microelectromechanical system device. Microelectromechanical system devices produced by the methods disclosed herein will generally include a substrate and flexures suspended over the substrate and supported by some sort of support member (e.g. posts). In manufacturing the MEMS device, a sacrificial layer may be deposited between the flexures and the substrate, thus supporting the flexures over the substrate during formation. It is to be understood that one or more flexures may be used in the system. For purposes of illustration, two flexures are depicted in the drawing figures.

It is contemplated that the substrate may be composed of any suitable material. Some nonlimitative examples of suitable substrate materials include silicon, polycrystalline silicon, silicon oxide containing dielectric substrates, alumina, sapphire, ceramic, plastic or other long chain organic polymers, and the like. Where the microelectromechanical system is incorporated into an integrated circuit, it is contemplated that the substrate will function as a semiconductor.

The flexures are also generally made of any suitable material capable of providing sufficient flexure at the desired configuration and thickness. The flexure may be made of various metals, metal alloys, metal compounds, silicon and/or mixtures thereof. Non-limiting examples of such materials include, but are not limited to, titanium and titanium compounds, tantalum and tantalum aluminum, amorphous silicon aluminum alloys and the like. It is also contemplated that the support member if present, which supports the flexure over the substrate, may be any suitable material including, but not limited to, metals.

Referring now to FIGS. 5A–5C, a build sequence for producing an embodiment of the microelectromechanical system 410 according to an embodiment of the method is depicted. The microelectromechanical system 410 includes a suitable substrate 412. One or more posts 414 may be established on the substrate 412 and project upward therefrom. The posts 414 act as supports for flexures 416. It is contemplated that any number of flexures 416 may be used in the microelectromechanical system 410, however, as depicted, two flexures 416 are supported over the substrate 412.

A sacrificial layer 420 may also be established on the substrate 412 in an area defined between the two posts 414. The sacrificial layer 420 may have numerous and various functions, one of which is to aid in establishment of the flexures 416 over the substrate 412 by supporting the flexures 416 during the fabrication process.

Once the sacrificial layer 420 and the posts 414 have been established on the substrate 412, the flexures 416 may be established in overlying relationship with the sacrificial layer 420 and in connection to a respective post 414. Alternatively, the posts 414 may be an extension of the flexure material and need to be separately defined.

In the method, a flexure protection layer 422 may be deposited over at least a portion of the flexures 416 such that a portion of each of the flexures 416 is left exposed. It is contemplated that the flexure protection layer 422 may be deposited over the flexures 416, patterned and/or etched using any suitable procedure that results in the exposure of a selected region of the flexures 416 at a region 418 distal to the respective post 414.

The flexure protection layer 422 may be composed of any suitable material that will protect the associated flexure 416 from overetch that may result during subsequent fabrication steps. A non-limitative example of a subsequent fabrication step includes etching the other elements of the microelectromechanical system 410. Non-limiting examples of materials suitable for use in the flexure protection layer 422 include amorphous silicons, polysilicons, silicon nitrides, silicon dioxides, photoresists and polyimides.

Where desired or required, the sacrificial layer 420 and/or one or more of the flexures 416 may be patterned and etched prior to the establishment of the flexure protection layer 422. Patterning and etching of the sacrificial layer 420 and/or one or more flexures 416 may be accomplished by any suitable technique or techniques.

It is also contemplated that the flexures 416 and flexure protection layer 422 stack may be patterned and etched subsequent to deposition of the flexure protection layer 422 as desired or required.

Now referring specifically to FIG. 5B, a flexure-engaging element 424 may be established in overlying relationship to the sacrificial layer 420 and exposed portions of flexures 416. The flexure-engaging element 424 may have any configuration appropriate for the associated MEMS device 410 under fabrication. One non-limiting example of such a MEMS device 410 is a spatial light modulator having a suitable flexure-engaging element 424 mounted on a flexure 416. It is contemplated that flexures 416 and the flexure-engaging element 424 may both be composed of suitable metals, metal mixtures, metal containing compounds, silicon, and/or mixtures thereof. Alternatively, flexure-engaging element 424 may be configured as a multiple layer film including metals and/or dielectric films.

It is contemplated that the microelectromechanical system device 410 may be configured such that a force may be applied to the flexure-engaging element 424 in order to move it up and down with respect to the substrate 412, thus making the consistency of the spring constant of the flexure 416 important.

The flexure-engaging element 424 may be configured in a manner that facilitates function of the associated MEMS device 410. To this end, it is contemplated that the flexure-engaging element 424 may be patterned and/or etched as desired and/or required. It is to be understood that such patterning and etching will occur while the flexure protection layer 422 is in place over the flexures 416. The flexure protection layer 422 advantageously substantially reduces or eliminates any damage that may occur during the etching of the flexure-engaging element 424.

The method of making the microelectromechanical system device 410 as disclosed herein further includes removing the flexure protection layer 422 and the sacrificial layer 420, as depicted in FIG. 5C. The flexure protection layer 422 and the sacrificial layer 420 may be removed simultaneously in situations where the materials employed in the respective layers 420, 422 are the same. However, in an alternate embodiment the flexure protection layer 422 may be removed subsequent to the removal of the sacrificial layer 420. In this alternate embodiment, a high selectivity etch is used to remove the flexure protection layer 422 without overetching the associated flexures 416 and thus advantageously maintaining the spring constant of the flexures 416 as originally deposited. Generally, in this alternate embodiment, the flexure protection layer 422 and the sacrificial layer 420 are composed of different materials.

It is contemplated that, prior to the removal of the flexure protection layer 422 and the sacrificial layer 420, the method may further include patterning and/or etching part or all of the stack composed of the flexure protection layer 422 and the flexures 416. It is to be understood that these patterning and/or etching processes are selected such that the spring constant of the flexures 416 is achieved and/or maintained.

Now referring to FIGS. 6A–6D, in an alternate embodiment of the method of forming a MEMS device 510, a substrate 512 is prepared having posts 514 and a sacrificial layer 520 located between the respective posts 514. As previously described, one or more flexures 516 (referred to as first and second flexures) are supported by the sacrificial layer 520 and connected to the posts 514. The flexure protection layer 522 may be deposited in a manner such that it (522) entirely covers the first and the second flexures 516, including a region 518 of the flexures 516 distal to the posts 514.

Figure 6A:
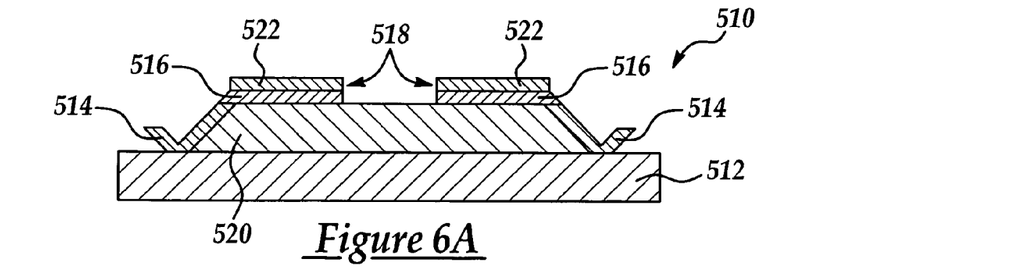
FIGS. 6A, 6B, 6C, and 6D are build sequences according to an alternate embodiment of the method.
Figure 6B:
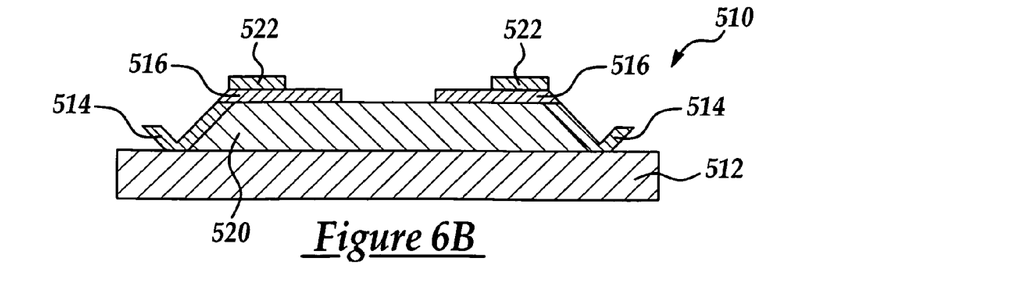

In this embodiment, portions of the deposited flexure protection layer 522 are removed to expose portions of the one or more flexures 516, as depicted in FIG. 6B. Any suitable etching process may be used such that the flexures 516 are substantially untouched.

The portion of the flexure protection layer 522 removed will typically be a flexure region suitable for subsequent fabrication operation. While any subsequent fabrication operation may be performed, one non-limitative example of such an operation includes the establishment of a flexure-engaging element 524 in contact with the exposed portions of the first and second flexure(s) 516. Suitable flexure-engaging elements 524 may be composed of metals, metal alloys, metal compounds, metal mixtures, dielectrics, amorphous silicon and/or mixtures thereof. It is to be understood, that in some instances the flexure-engaging element 524 material may be the same, similar to or compatible with the material(s) employed in the flexure(s) 516. It is contemplated that establishment of the flexure-engaging element 524 and contact between the two elements 516, 524 will occur in a manner that permits sufficient bonding between the two respective elements 516, 524 to facilitate subsequent function of the resulting MEMS device 510. Where desired and/or required, the subsequently deposited flexure-engaging element 524 material may be one that will serve to protect an underlying portion of the flexure 516 during subsequent fabrication operations.

Prior to the removal of a portion of the flexure protection layer 522, the flexure protection layer 522 may be configured by patterning and/or etching as desired or required. It is to be understood that the patterning and/or etching of the flexures 516 and the flexure protection layer 522, prior to its partial removal, may be performed simultaneously or sequentially as desired or required.

Figure 6C:
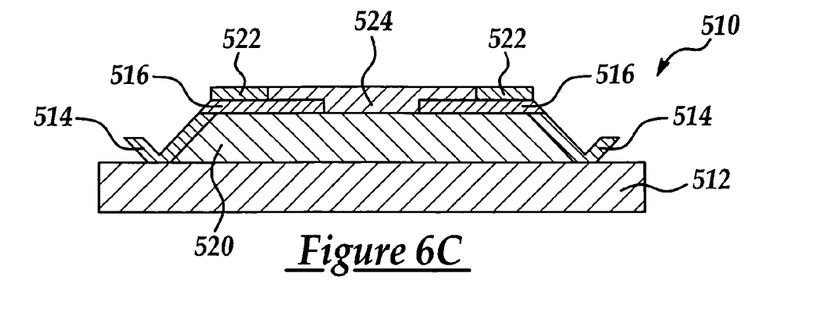

After the patterning, etching, and/or partial removal of the flexure protection layer 522, a flexure-engaging element 524 may be deposited such that it is in contact with the exposed portion of the first and second flexures 516 and with the sacrificial layer 520. The addition of the flexure-engaging element 524 is shown in FIG. 6C. As previously described, the flexure-engaging element 524 may be made of metals, metal compounds, metal mixtures, metal alloys, dielectrics, amorphous silicon and/or mixtures thereof as desired and/or required. It is contemplated that the flexure-engaging element 524 may be configured in a manner appropriate for subsequent patterning and etching. The patterning and etching of the flexure-engaging element 524 may occur while the flexure protection layer 522 is in contact with the associated flexure(s) 516 thereby substantially preventing or minimizing adverse effects of the etch process on the flexures 516.

Figure 6D:
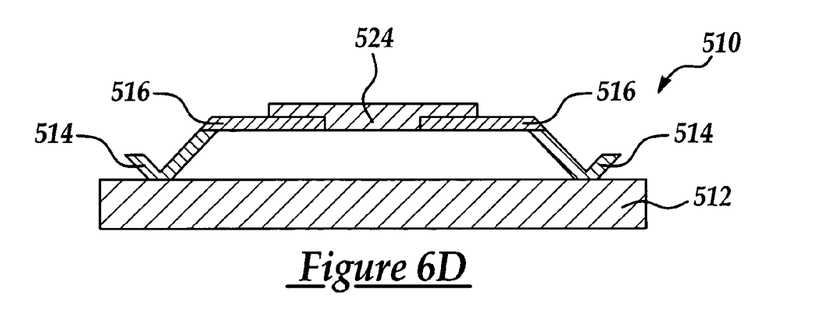

FIG. 6D illustrates the removal of the flexure protection layer 520 and the sacrificial layer 520. Removal may be accomplished by any suitable removal technique including simultaneous etching of the two layers 520, 522 and/or a highly selective etch if the flexure protection layer 522 is made of a material other than sacrificial layer 520 material.

The microelectromechanical system device 410, 510 formed by embodiments of the method described herein includes flexures 416, 516 exhibiting essentially uniform thickness in the regions both distal and proximate to the posts 414, 514. It is contemplated that the thickness of the flexures 416, 516 is sufficient to provide a spring constant within a defined range defined by the end use of the resulting microelectromechanical system device 410, 510. It is contemplated that in forming the microelectromechanical system device 410, 510 according to any of the various embodiments disclosed herein, the spring constant of the flexures 416, 516 as originally established, is substantially maintained after the removal of the sacrificial layer 420, 520 and the flexure protection layer 422, 522. It is believed, without being bound to any theory, that the addition of the flexure protection layer 422, 522 in the method helps to substantially maintain the thickness of the flexures 416, 516 and the associated spring constant, despite the fact that both are subjected to various etching processes. It is contemplated that after the various fabrication steps are performed and the microelectromechanical system device 410, 510 is formed, the flexures 416, 516 have a surface that is characterized by minimal evidence of etch artifacts. The spring constant of the flexures 416, 516 ranges between about $1^{-4}$ Newton/meter and about $1^{-8}$ Newton/meter and is maintained throughout the method as described herein above. As used herein, the term "etch artifacts" is taken to mean surface and materials qualities typically associated with a material after undergoing at least one etch process. While this term may be construed to include localized generalized thinning or reduction in at least one region of the flexure 416, 516, it is also contemplated that etch artifacts may include modification of the flexure 416, 516 material on an atomic or subatomic level due to unwanted exposure to an etch material or materials. This may include residence of trace etch material in the flexure 416, 516 material as well as modification of the material in at least one region of the flexure 416, 516 due to contact between the etch material and the flexure 416, 516.

It is to be understood that microelectromechanical system devices 410, 510 formed according to the various embodiments as disclosed herein may be used in a variety of applications including, but not limited to, spatial light modulators, integrated circuits and display devices.

Figure 7:
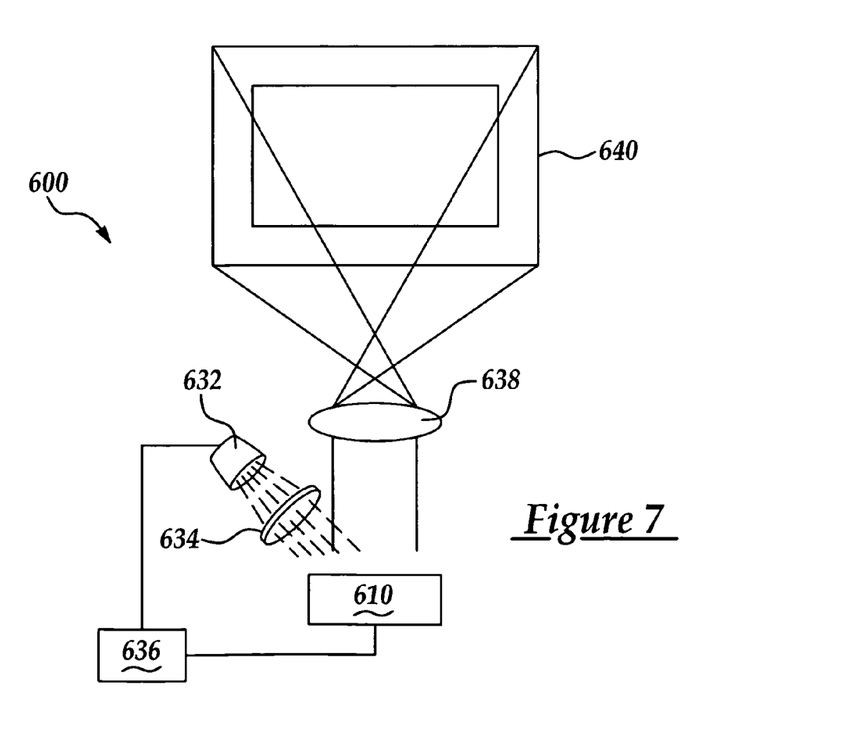
FIG. 7 is a schematic view of a display device utilizing an embodiment of a microelectromechanical system of the present invention.

A device 600 utilizing a microelectromechanical device 410, 510 formed by the method disclosed herein as a spatial light modulator is depicted in FIG. 7. It is contemplated that the display device 600 may include at least one MEMS device 410, 510, for example, in a light modulation device 610. As depicted in FIG. 7, light from light source 632 is focused on a light modulation device 610 by lens 634. Although shown as a single lens 634, the lens 634 is typically a group of lenses, integrators, and mirrors that together focus and direct light from light source 632 onto the surface of the light modulation device 610. Image data and control signals from controller 636 are written onto a suitable memory element such as a SRAM cell, DRAM cell, capacitor or the like, associated with each light modulation device 610 incorporating the microelectromechanical system device 410, 510 disclosed herein. The data in these associated cells cause some of the microelectromechanical system devices 410, 510 to shift to an "on" state. Devices that are shifted to an "off" state can absorb light. While multiple devices are shifted to an "on" position to reflect light to projection lens 638, a single device is shown for simplicity. Projection lens 638 focuses the light modulated by the light modulation device 610 onto a single image plane or screen 640.

While the invention has been described in connection with what is presently considered to be the most practical and preferred embodiment, it is to be understood the invention is not limited to the disclosed embodiment, but on the contrary, is intended to cover various modifications and equivalent arrangements included within the spirit and scope of the appended claims, which scope is to be accorded the broadest interpretation so as to encompass all modifications and equivalents.

What is claimed is:

1. A method of making a microelectromechanical system, comprising the steps of:

establishing a flexure protection layer over at least a portion of a flexure located on a substrate such that at least a portion of the flexure is exposed;

establishing contact between at least one flexure-engaging element and the exposed portion of the flexure; and removing the flexure protection layer subsequent to at least one of patterning and etching the flexure-engaging element;

wherein the flexure protection layer is established in overlying relationship with at least two flexures, the at least two flexures located on the substrate and supported by a sacrificial layer positioned between the at least two flexures.

2. The method as defined in claim 1 wherein the flexure is supported by at least one sacrificial layer, the at least one sacrificial layer positioned between the flexure and the substrate.

3. The method as defined in claim 2 wherein the flexure-engaging element is located in overlying relationship with the sacrificial layer, and the method further comprises the step of removing the sacrificial layer.

4. The method as defined in claim 3, further comprising the step of configuring the flexure-engaging element prior to removal of the flexure protection layer and the sacrificial layer, the configuring step including at least one of patterning and etching.

5. The method as defined in claim 3 wherein removal of the flexure protection layer and removal of the sacrificial layer are accomplished simultaneously.

6. The method as defined in claim 2, wherein prior to establishing the flexure protection layer, the method further comprises the steps of:

depositing the at least one sacrificial layer on the substrate;

configuring the sacrificial layer by at least one of patterning and etching; and establishing the flexure on the at least one sacrificial layer.

7. The method as defined in claim 1 wherein the flexure is subjected to at least one of patterning and etching prior to establishing the flexure protection layer.

8. The method as defined in claim 1, further comprising the step of configuring the flexure protection layer prior to establishing contact between the at least one flexure-engaging element and the exposed portion of the flexure, the configuring step including at least one of patterning and etching a portion of the flexure protection layer.

9. The method as defined in claim 1 wherein the flexure protection layer comprises at least one of amorphous silicon, polysilicon, silicon nitride, silicon dioxide, and polyimide.

10. The method as defined in claim 1 wherein the flexure protection layer establishing step comprises:

establishing a flexure protection layer in overlying relationship to the flexure; and selectively removing a portion of the flexure protection layer to provide an exposed flexure region.

11. The method as defined in claim 10 further comprising:

patterning at least a portion of the established flexure protection layer and associated flexure; and etching the patterned flexure protection layer and associated flexure;

wherein the patterning and etching steps occur prior to the selective removal step.

12. The method as defined in claim 1 wherein the flexure protection layer is deposited over substantially the entire at least two flexures and the method further comprises removing a portion of the deposited flexure protection layer from the at least two flexures such that a portion of each of the at least two flexures is exposed.

13. The method as defined in claim 1 further comprising the steps of:
   configuring the sacrificial layer by at least one of patterning and etching; and
   removing the sacrificial layer.

14. The method as defined in claim 13 wherein the flexure-engaging element is located in overlying relationship with the sacrificial layer, wherein the patterning and etching the flexure-engaging element occurs before removing the flexure protection layer and the sacrificial layer.

15. The method as defined in claim 1 wherein the at least two flexures are subjected to at least one of patterning and etching prior to establishing the flexure protection layer.

16. The method as defined in claim 1 further comprising the step of configuring the flexure protection layer, the configuring step including at least one of patterning and etching the flexure protection layer prior to removal of the flexure protection layer.

17. The method as defined in claim 1 wherein the flexure protection layer contains at least one of amorphous silicon, polysilicon, silicon nitride, silicon dioxide, and polyimide.

18. The method as defined in claim 1 wherein the flexure-engaging element contains at least one of metals, metal alloys, metal mixtures, metal compounds, dielectrics, amorphous silicons, and mixtures thereof.

19. The method as defined in claim 1 wherein the at least two flexures contain at least one of metals, metal compounds, metal alloys, silicons and mixtures thereof.

20. A method of making a microelectromechanical system device, comprising the steps of:
   patterning a portion of a flexure having a flexure protection layer deposited thereon, the flexure located on a substrate and supported by a sacrificial layer positioned between the substrate and the flexure, wherein patterning of the flexure and the flexure protection layer occur simultaneously;
   etching a portion of the flexure and the flexure protection layer subsequent to the patterning step;
   removing a portion of the flexure protection layer from the flexure such that a portion of the flexure is exposed;
   depositing a flexure-engaging element over the sacrificial layer and in contact with the exposed portion of the flexure;
   configuring the flexure-engaging element; and then
   removing the flexure protection layer and the sacrificial layer.

21. The method as defined in claim 20 wherein configuring the flexure-engaging element is accomplished by patterning and etching.

22. The method as defined in claim 20 further comprising the step of configuring the sacrificial layer by patterning and etching, the configuring occurring prior to removing a portion of the flexure protection layer.

23. The method as defined in claim 20 wherein removal of the flexure protection layer and the sacrificial layer are accomplished simultaneously.

24. The method as defined in claim 20 wherein the flexure protection layer contains at least one of amorphous silicon, polysilicon, silicon nitride, silicon dioxide, and polyimide.

25. The method as defined in claim 20 wherein the flexure-engaging element contains at least one of metals, metal alloys, metal mixtures, metal compounds, dielectrics, amorphous silicons, and mixtures thereof.

* * * * *